United States Patent [19]
Kim et al.

[11] Patent Number: 5,857,576
[45] Date of Patent: Jan. 12, 1999

[54] WAFER CARRIER WITH AN ANTI-SLIP SURFACE

[75] Inventors: Moon-Kwan Kim; Dong-Myung Park, both of Suwon, Rep. of Korea

[73] Assignee: Samsung Electronics Co., Ltd., Suwon, Rep. of Korea

[21] Appl. No.: 757,085

[22] Filed: Nov. 26, 1996

[30] Foreign Application Priority Data

Nov. 27, 1995 [KR] Rep. of Korea ................. 1995 35951

[51] Int. Cl.⁶ ...................................................... A47F 7/00
[52] U.S. Cl. ...................................................... 211/41.18
[58] Field of Search ..................... 211/41.18; 206/710, 206/454

[56] References Cited

U.S. PATENT DOCUMENTS

| | | | |
|---|---|---|---|
| 4,228,902 | 10/1980 | Schulte | 211/41.18 |
| 4,471,716 | 9/1984 | Milliren | 211/41.18 X |
| 4,687,097 | 8/1987 | Mortensen | 211/41.18 |
| 5,476,176 | 12/1995 | Gregerson et al. | 211/41.18 X |
| 5,538,230 | 7/1996 | Sibley | 211/41.18 X |

*Primary Examiner*—Alvin C. Chin-Shue
*Assistant Examiner*—Sarah Purol
*Attorney, Agent, or Firm*—Jones & Volentine, L.L.P.

[57] ABSTRACT

A wafer carrier having an anti-slip structure formed on outward surface portions of side plates of the wafer carrier. The anti-slip structure may be composed of at least one of several shapes or structures such as grooves, round shape projections, and acute angle shaped projections, each which is formed on both the outward surface portions. The wafer carrier having such an anti-slip structure prevents the wafer carrier from slipping or falling while the wafer carrier is being transported.

11 Claims, 4 Drawing Sheets

WAFER CARRIER WITH AN ANTI-SLIP SURFACE

This application corresponds to Korean Utility Model Application No. 95-35951 field Nov. 27, 1995, in the name of Samsung Electronics Co., Ltd., which is hereby incorporated by reference in its entirety.

BACKGROUND OF THE INVENTION

1. Field of the Invention

The present invention relates to a wafer carrier for transporting wafers contained therein during the fabrication of semiconductor devices, and more particularly, to a wafer carrier with an outward surface portion having an anti-slip structure.

2. Description of the Related Arts

In fabricating semiconductor devices, various different process steps are carried out in accordance with the type and function of the particular semiconductor wafer (thereinafter, referred to as "wafer"). After the completion of process steps for depositing materials on the wafers to form films thereon, and then selectively etching or polishing the films, the wafers are collected in a wafer carrier and transported to another place. Then the wafers in the wafer carrier are unloaded for subsequent processing steps. In many cases, the collected wafers may be temporarily located in a closed cleaning box in a related working area prior to performing the subsequent process steps.

As described immediately above, when the wafers must be transported in a conventional wafer carrier from one working area to another, they may be transported manually by an operator, or by a wafer carrier transport system. Especially, in the former case, the wafer carrier often slips out of the hands of the operator because outward surface portions of the carrier are flat and even, resulting in damage to the wafers and a decrease in yield and productivity.

Referring to FIG. 1, a conventional wafer carrier 6 has a carrier body with an inner curved surface extending from a first lateral edge 2a of the body to a second lateral edge 2b of the carrier body, and slots 2 in the inner surface of the body extending generally continuously from the first lateral edge 2a to the second lateral edge 2b. The carrier 6 further has feet 4 extending from the body for holding the wafers in an upright position. The carrier body is substantially defined by a bottom plate, a pair of opposing side plates 1a and 1b, and front and rear plates 3a and 3b. Each of the plates 3a and 3b extends between both ends of the side plates 1a and 1b, as shown in FIG. 1. Also the inner curved surface extends from the first lateral edge 2a of the body (i.e., an edge of the side plate 1a), along the bottom plate, to the second lateral edge 2b (i.e., an edge of the side plate 1b).

Each of the slots 2 are defined by a bottom wall and pair of opposing side walls which are constructed to support a wafer. The slots 2 may each receive a portion of an outwardly facing peripheral edge of each wafer to support the wafers in an upright position, and the distance between the slots is in the range of about 2 mm to 5 mm. It is understood that each of the slots has a depth suitable for receiving the wafer (not shown).

In the above wafer carrier 6, since the outward surfaces of the side plates 1a and 1b are flat and even as shown in FIG. 1, the wafer carrier may fall or slip out of an operator's hand while transferring the wafers, whereby the wafers may be damaged or broken.

SUMMARY OF THE INVENTION

Accordingly, it is an object of the present invention to a provide a wafer carrier whose outward surface portion has a anti-slip structure so as to prevent the carrier from slipping or falling during transfer.

According to an aspect of the present invention, there is provided a wafer carrier for transporting semiconductor wafers residing therein, comprising: a carrier body having a pair of opposing side plates joined to a bottom plate therebetween, and an inner curved surface extending from a first lateral edge of one of the side plates, along the bottom plate, and to a second lateral edge of the other of the side plates; slots located in the inner curved surface of the body extending generally continuously from the first lateral edge to the second lateral edge, for receiving the wafers in an upright position, the slots having a bottom wall and opposing side walls; and anti-slip means formed on an outward surface of each of the side plates, whereby the wafer carrier may be safely transported to another location.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF THE PRESENT INVENTION

Figure 1:
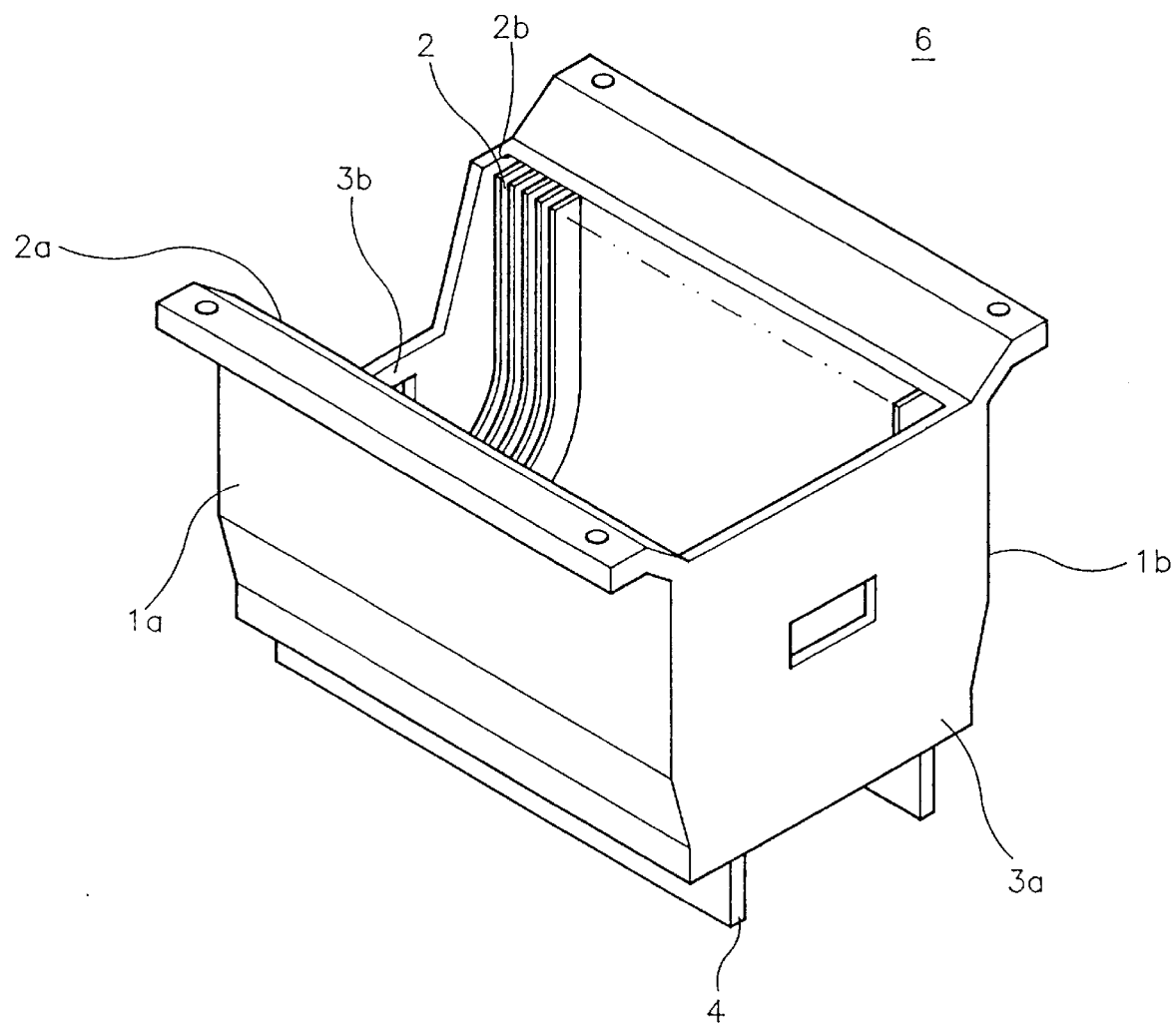
FIG. 1 is a perspective view showing the structure of a conventional wafer carrier.

Referring to FIGS. 2 through 5, the novel wafer carrier of the present invention, shown generally as reference numeral 6, has an anti-slip means comprised of structures having various shapes disposed on the outer surfaces of the side plates of the carrier body. By way of example and not limitation, these shapes may be grooves, round shaped projections, acute angle shaped projections, and the like, which are formed on each of the outward surface portions of the side plates 1a and 1b. It is understood that many different shapes for the grooves and projections are contemplated within the practice of this invention, the common feature being to provide a structure that deviates from the smooth and flat surface of the conventional wafer carrier side plates. Such an anti-slip means prevents the wafer carrier 6 from slipping or falling out of an operator's hands, or the grip of a wafer transport carrier, thereby reducing damage or breakage of the wafers.

Throughout the drawings, the same reference numerals refer to the same or like parts.

Embodiment 1

Figure 2:
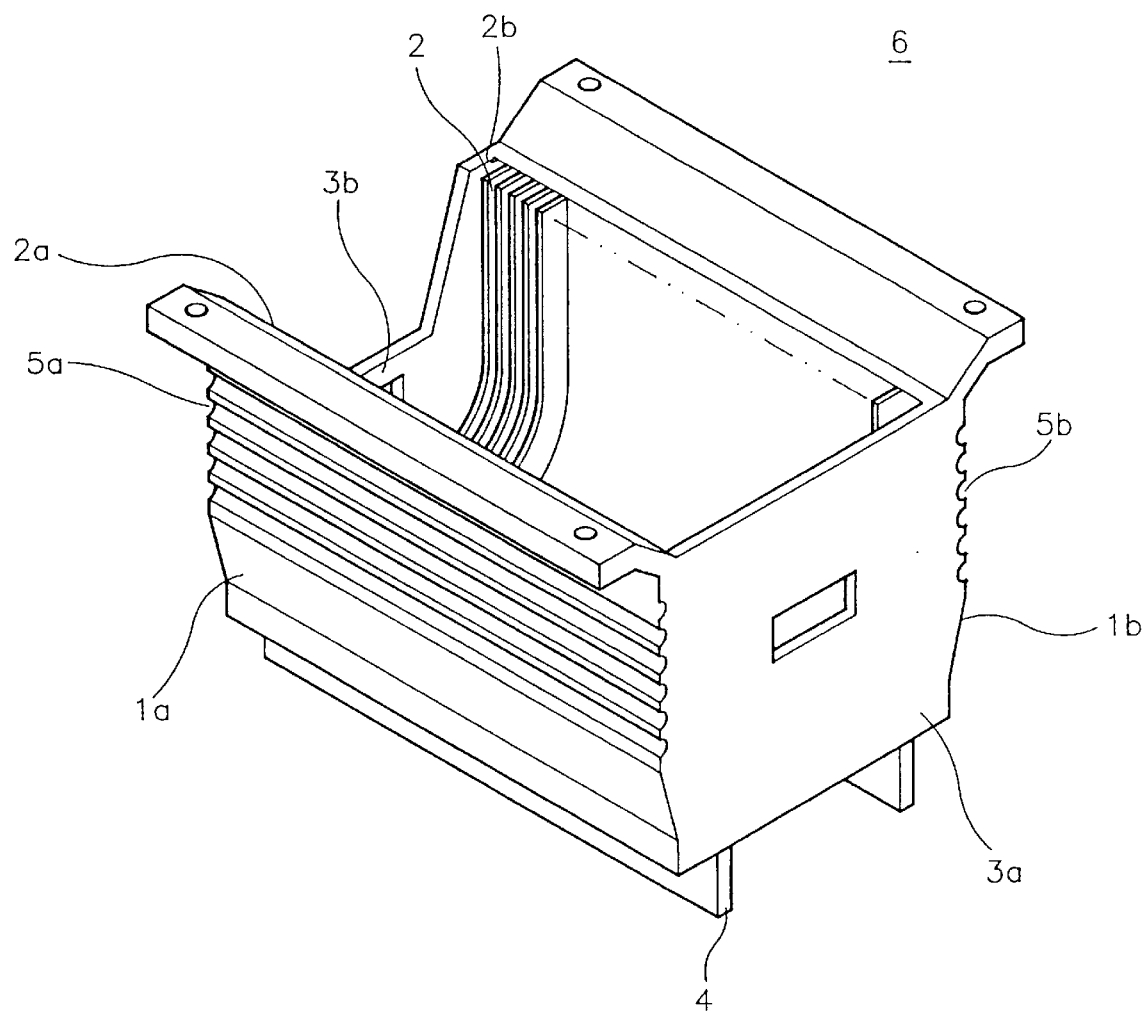
FIG. 2 is a perspective view showing the structure of a novel wafer carrier with an anti-slip function according to a first embodiment of the present invention.

Referring to FIG. 2, the wafer carrier 6 according to a first embodiment of the present invention has the same structure as that of FIG. 1 except that an anti-slip means comprising grooves 5a and 5b are respectively formed on each of the side walls 1a and 1b of the wafer carrier.

As described above, the wafer carrier 6 in FIG. 2 comprises a carrier body having an inner curved surface extending from a first lateral edge 2a to the second lateral edge 2b. The carrier 6 also has feet 4 extending from the body for holding the wafers in an upright position. The carrier body is substantially defined by a bottom plate and the pair of opposing side plates 1a and 1b joined thereto. The inner curved surface extends from the first lateral edge 2a of the body (i.e., an edge of the side plate 1a), along the bottom plate, to the second lateral edge 2b (i.e., an edge of the side plate 1b). The carrier body also has opposing front 3a and rear plates 3b extended between and joined to the side plates 1a and 1b.

The slots 2 are defined by the bottom wall and the pair of opposing side walls, which are constructed to support a wafer. The slots 2 each receive a portion of a thin, outwardly facing peripheral edge of each wafer to support the wafers in an upright position. The distance between the slots 2 is in the range of about 2 mm to 5 mm.

Figure 3:
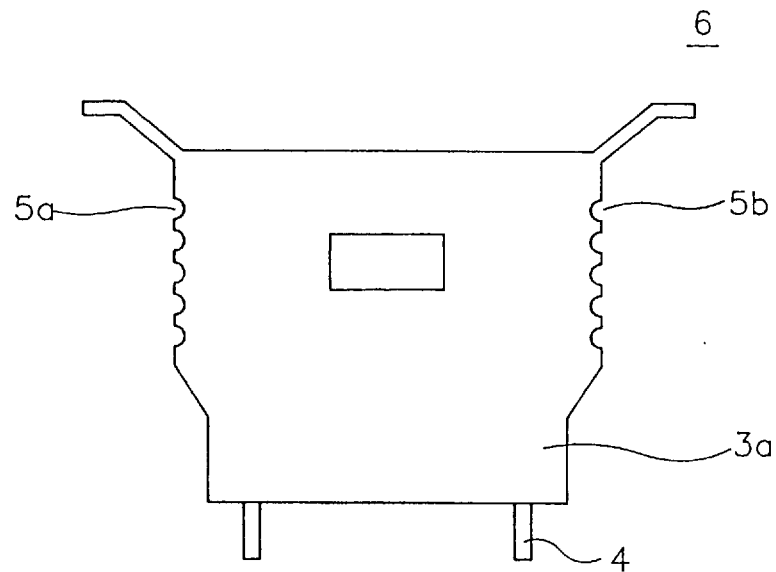
FIG. 3 is a front view of the wafer carrier shown in FIG. 2, in which a plurality of anti-slip grooves are formed on each of the outward surface portions of the side walls of the carrier.

As shown in FIGS. 2 and 3, the grooves 5a and 5b, functioning as the anti-slip means, are respectively formed on both outward surface portions of the opposing side plates 1a and 1b of the body. In this example, a plurality of anti-slip rounded grooves are continuously formed on each outward surface of the side plates 1a and 1b.

As described above, if an operator grasps the wafer carrier with the anti-slip means so as to transport it to another working area, it is possible for the operator to safely transport the carrier, since the anti-slip means prevents the wafer carrier from slipping and falling out of the operator's hands.

In addition, since the anti-slip means also has rounded grooves 5a and 5b, particles generated during cleaning or other fabrication processes easily flow downward, thus preventing the particles from piling up in the grooves.

EXAMPLE 2

Figure 4:
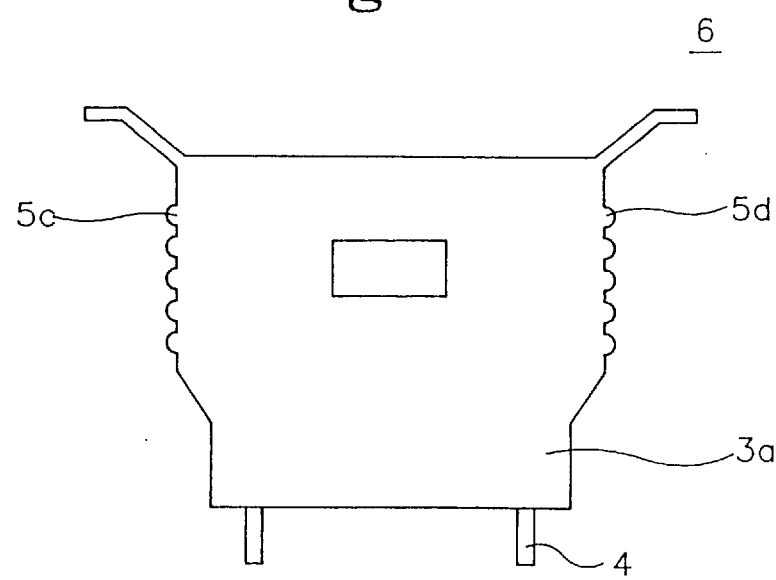
FIG. 4 is a front view showing the structure of a novel wafer carrier with an anti-slip feature according to a second embodiment of,the present invention.

In a second embodiment, with reference to FIG. 4, the wafer carrier 6 has the same structure as that of the wafer carrier shown in FIG. 3, except that round shaped projections 5c and 5d are formed on each of the opposing side walls 1a and 1b to function as the anti-slip means.

In this embodiment, a plurality of round shaped projections are continuously formed on each of the opposing side walls 1a and 1b of the carrier body to prevent the wafer carrier 6 from slipping and falling during transport to another work area. Like the embodiment illustrated with regard to FIGS. 2 and 3, the round shaped projections of the wafer carrier in this second embodiment allow particles generated during cleaning or other fabrication processes to easily flow downward, thus preventing the particles from piling up along the projections 5c and 5d.

EXAMPLE 3

Figure 5:
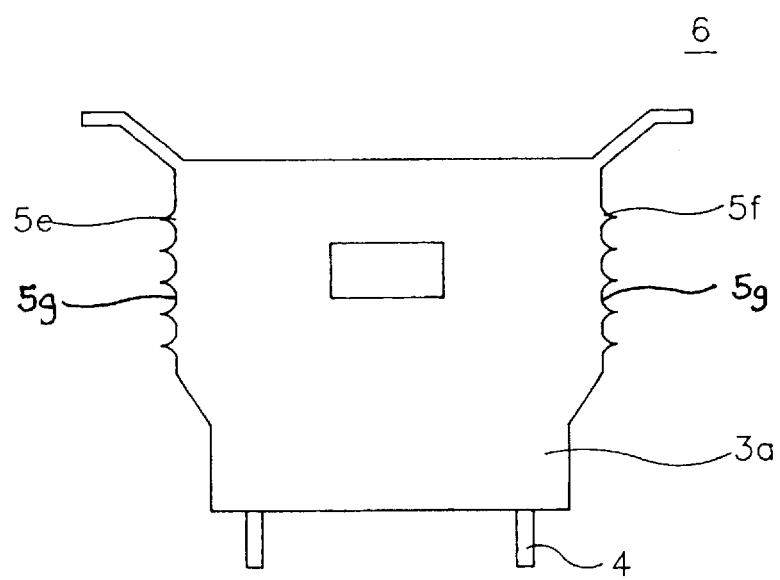
FIG. 5 is a front view showing the structure of a novel wafer carrier with an anti-slip feature according to a third embodiment of the present invention.

In a third embodiment, with reference to FIG. 5, the wafer carrier 6 has the same structure as that of the wafer carrier shown in FIG. 4, except that acute angle shaped projections 5e and 5f are formed on each of the opposing side walls 1a and 1b to function as the anti-slip means.

In this embodiment, a plurality of acute angle shaped projections are continuously formed on each of the opposing side walls 1a and 1b of the body to prevent the wafer from slipping and falling during transport. The anti-slip means also has round shaped grooves 5g formed between the acute angle shaped projections 5e and 5f.

The grooves 5g may have a depth that extends into the side plates as shown in FIG. 3, or they may have a depth that extends only to the edge surface defined by the juncture of the side plates with the front and rear plates, as shown in FIG. 5.

Of the embodiments described above, the wafer carrier 6 of the third embodiment in FIG. 5 has the best anti-slip and particle reduction properties.

While the present invention has been described and illustrated with reference to a preferred embodiments thereof, it is to be readily understood that the present invention is not limited to these embodiments, and various changes and modifications can be made therein without departing from the spirit and scope of the invention defined in the appended claims.

What is claimed is:

1. A wafer carrier for transporting semiconductor wafers residing therein, comprising:

a carrier body having a pair of opposing side plates joined to a bottom plate therebetween, and an inner curved surface extending from a first lateral edge of one of the side plates, along the bottom plate, and to a second lateral edge of the other of the side plates;

slots located in the inner curved surface of the body extending generally continuously from the first lateral edge to the second lateral edge, for receiving the wafers in an upright position, said slots having a bottom wall and opposing side walls; and a plurality of undulations disposed along a substantial vertical extent of an outward surface of each of the side plates, whereby the wafer carrier may be safely transported to another location.

2. The wafer carrier of claim 1, wherein said plurality of undulations comprises a plurality of grooves formed on each of the outward surfaces of the side plates.

3. The wafer carrier of claim 2, wherein each of said grooves has a rounded shape.

4. The wafer carrier of claim 1, wherein said plurality of undulations comprises a plurality of projections extending from each of the outward surfaces of the side plates.

5. The wafer carrier of claim 4, wherein each of said projections has a rounded shape.

6. The wafer carrier of claim 4, wherein each of said projections has a acute angled shape.

7. The wafer carrier of claim 1, wherein said plurality of undulations comprises a plurality of projections, of acute angled shape, extending from each of the outward surfaces of the side plates, and having rounded shape grooves formed between the acute angled projections.

8. The wafer carrier of claim 7, wherein said rounded grooves have a depth that extends into the side plates.

9. The wafer carrier of claim 7, wherein said rounded grooves have a depth limited to an edge surface defined by the juncture of the side plates with the front and rear plates.

10. The wafer carrier of claim 1, wherein said plurality of undulations extend downward from below an upper, laterally-extended lip of each of the side plates.

11. The wafer carrier of claim 10, wherein said plurality of undulations extend downward to a position on each of the side plates below a center point of a wafer in the wafer carrier.

* * * * *